(12) United States Patent
Vice

(10) Patent No.: US 7,696,825 B2
(45) Date of Patent: Apr. 13, 2010

(54) APPARATUS FOR RECEIVING INPUT AND BIAS SIGNALS AT COMMON NODE

(75) Inventor: Michael Wendell Vice, El Granada, CA (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 78 days.

(21) Appl. No.: 12/108,034

(22) Filed: Apr. 23, 2008

(65) Prior Publication Data

US 2009/0267694 A1    Oct. 29, 2009

(51) Int. Cl.
*H03F 3/45* (2006.01)

(52) U.S. Cl. .................................................. 330/261

(58) Field of Classification Search ............... 330/66, 330/261, 307

See application file for complete search history.

(56) References Cited

U.S. PATENT DOCUMENTS

2009/0153244 A1 * 6/2009 Cabanillas et al. .......... 330/253

* cited by examiner

*Primary Examiner*—Steven J Mottola

(57) ABSTRACT

An apparatus includes an input-bias node and an internal load. The input-bias node is configured to simultaneously receive an input signal and a bias signal through an input-bias port. The internal load is connected between the input-bias node and multiple output ports, at least one of the output ports outputting an output signal based on the input signal received at the input-bias node.

19 Claims, 4 Drawing Sheets

APPARATUS FOR RECEIVING INPUT AND BIAS SIGNALS AT COMMON NODE

BACKGROUND

Conventional amplifiers may incorporate integral load elements. The load elements are typically combined as a single node, into which a bias signal is injected. For example, FIG. 1 is a block diagram of a conventional amplifier 100, which includes resistors 110 and 120 as load elements. The bias port 130 is connected to bias node N101, to which resistors 110 and 120 are also connected.

The amplifier 100 also includes transistors 112 and 122, which may be field effect transistors (FETs), such as gallium arsenide field-effect transistors (GaAsFETs), for example. Transistor 112 includes a drain connected the resistor 110 and output port 136, a source connected to current source 140 and a gate connected to input port 132. Transistor 122 includes a drain connected the resistor 120 and output port 138, a source connected to the current source 140 and a gate connected to input port 134.

The amplifier 100, as depicted in FIG. 1, is a differential amplifier, in that it receives differential input signals through the input ports 132 and 134, respectively. The differential amplifier amplifies the difference between voltages of the two input signals and provides corresponding amplified output signals (e.g., through the output ports 136 and 138). Alternatively, the gate of transistor 122 may be connected to ground, such that the amplifier 100 receives only one input signal through the input port 132, and outputs corresponding balanced output signals through output ports 136 and 138, thus effectively operating as an active balun.

The amplifier 100 may be implemented in the form of a semiconductor integrated circuit (IC) chip or die, and each of the ports (bias port 130, input ports 132, 134 and output ports 136, 138) therefore has an associated input/output (I/O) package pin for receiving and sending signals outside the amplifier 100. For example, the bias port 130 has an associated I/O package pin to interface with an externally provided bias signal, through which the bias node N101 receives a bias supply voltage. Likewise, the input ports 132, 134 and the output ports 136, 138 have corresponding separate I/O package pins.

Due to higher component integration and diminished chip space in integrated circuits driven by demand for smaller electronic devices, there is a need to reduce or limit the number of isolated connections, e.g., requiring separate I/O package pins, utilized by a particular component, such as the amplifier 100. Having separate input and bias ports contributes to this shortage of I/O package pins.

SUMMARY

In a representative embodiment, an apparatus includes an input-bias node and an internal load. The input-bias node is configured to simultaneously receive an input signal and a bias signal through an input-bias port. The internal load is connected between the input-bias node and multiple output ports. At least one of the output ports outputting an output signal based on the input signal received at the input-bias node.

In another representative embodiment, a system for amplifying an input signal includes a diplexer configured to combine the input signal and a bias signal, and an input-bias node connected to an input-bias port configured to receive the combined signal from the diplexer. A first resistance is connected in series between the input-bias node and a first output port, and a second resistance is connected in series between the input-bias node and a second output port. A first transistor is connected between the first output port and a current source, and gated to a first capacitor connected to the input-bias node. A second transistor is connected between the second output port and the current source. Balanced output signals based on the input signal are provided through the first and second output ports.

In another representative embodiment, an amplifier includes an input-bias node, first and second resistances, and first and second field effect transistors (FETs). The input-bias node is configured to receive an input signal and a direct current (DC) bias signal through an input-bias port. The first resistance is connected in series between the input-bias node and a first output port, and the second resistance is connected in series between the input-bias node and a second output port. The first FET is connected between the first output port and a current source, the first FET having a first gate connected to the input-bias node through a capacitor. The second FET is connected between the second output port and the current source, the second FET having a second gate connected to at least one of a ground voltage and an input port.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

Figure 1:
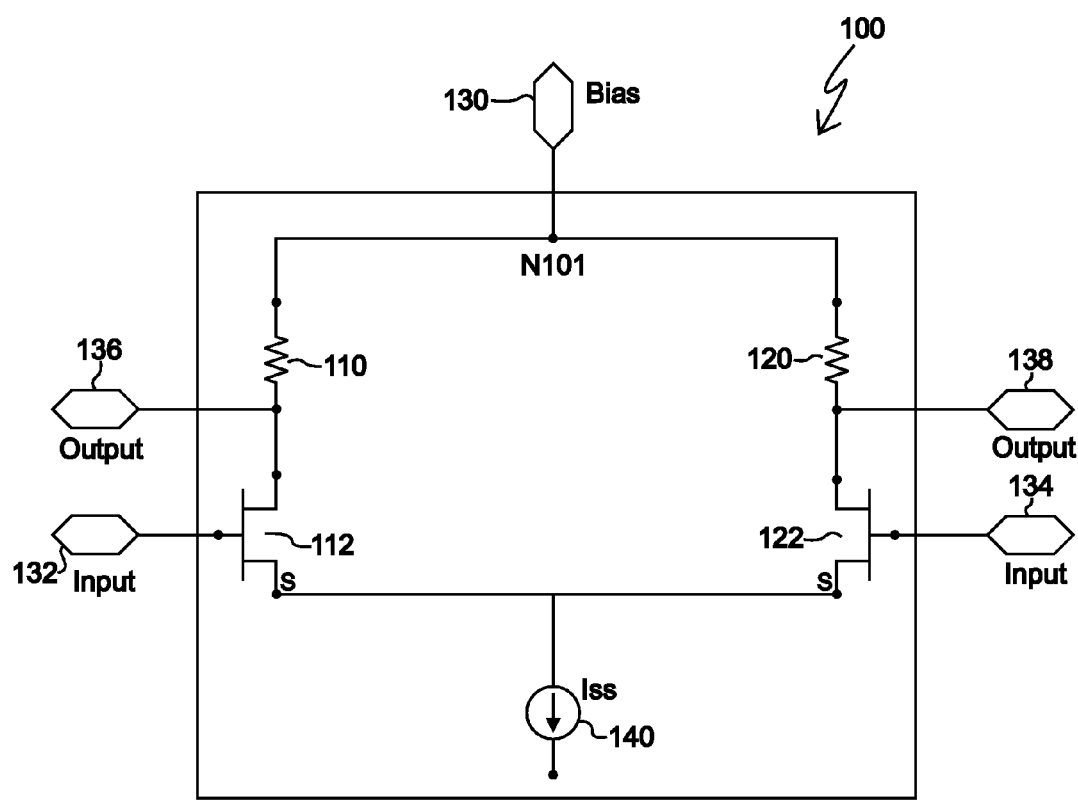
FIG. 1 is a block diagram illustrating a conventional differential amplifier.
Figure 2:
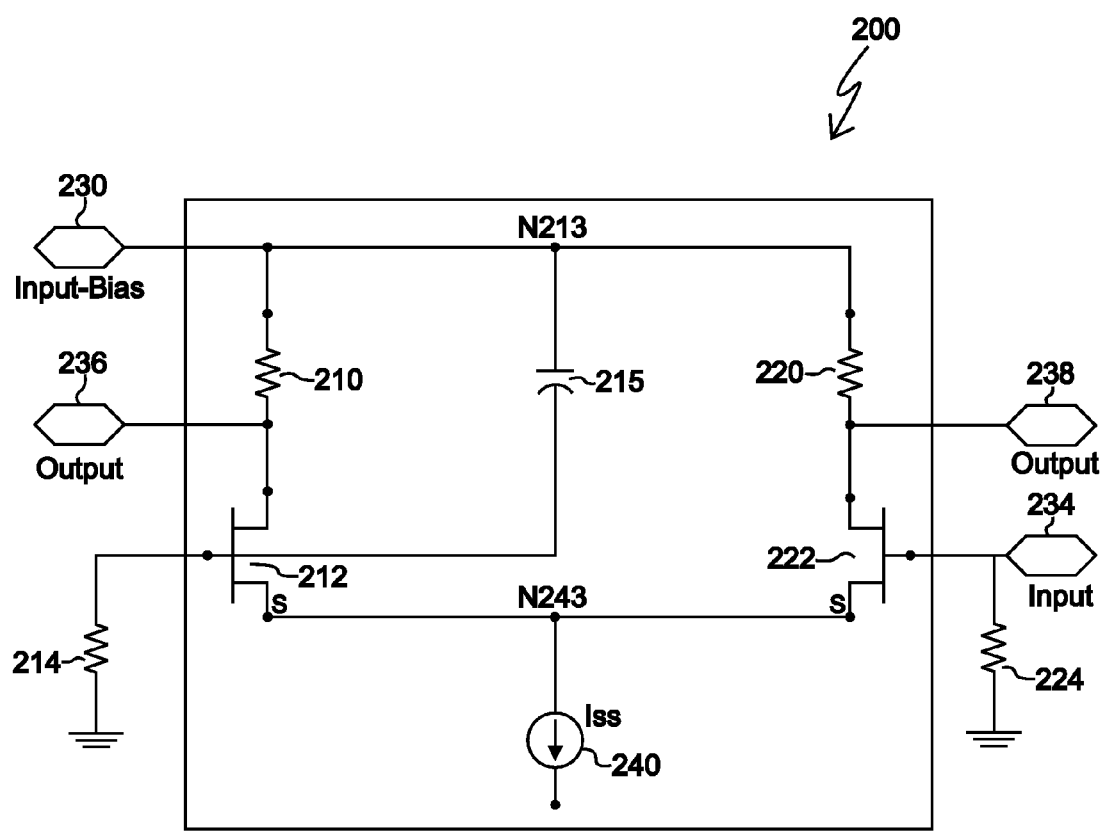
FIG. 2 is a block diagram illustrating an amplifier, according to a representative embodiment.

FIG. 2 is a block diagram illustrating an amplifier, according to an illustrative embodiment. In particular, FIG. 2 shows an exemplary differential amplifier 200 having a combined input-bias port 230, which is configured to receive both an input signal and a bias signal, e.g., through the same I/O package pin. For example, the input-bias port 230 may receive a combined input-bias signal, which may be formed by combining the input signal and the bias signal according to any appropriate technique. For example, the combined input-bias signal may include multiplexed (or diplexed) input and bias signals, discussed below with reference to FIG. 4, or the input signal riding on top of the (direct current (DC)) bias signal. In alternative embodiments, the input signal and the bias signal may be received separately through the combined input-bias port 230, for example, at different times. Combining the input port and the bias port of conventional components into the input-bias port 230 frees up an I/O package pin, enabling higher integration, smaller size, fewer connections, etc. This is particularly true in systems having numerous amplifiers, configured as shown in FIG. 2, for example.

The input-bias port 230 is connected to input-bias node N213, which is common to the internal loads of the amplifier 200, depicted as resistors 210 and 220. In alternative embodiments the internal loads may be active or reactive loads, and may include, for example, transistors or other resistive elements, as opposed to (or in addition to) resistors 210 and 220. The resistance values of resistors 210 and 220 may vary to provide unique benefits for any particular situation or to meet application specific design requirements of various implementations, as would be apparent to one skilled in the art.

In the depicted illustrative embodiment, the amplifier 200 includes transistors 212 and 222. The transistors 212 and 222 may be field-effect transistors (FETs), such as GaAs FETs, for example. However, other types of FETs and/or other types of transistors within t-he purview of one of ordinary skill in the art may be incorporated into the amplifier 200, without departing from the spirit and scope of the present teachings. For example, the transistors may include silicon bipolar junction transistors (BJTs), metal-oxide semiconductor FETs (MOSFETs), high electron mobility transistors (HEMTs), pseudomorphic HEMTs, heterostructure FETs (HFETs), etc.

Transistor 212 includes a drain connected to resistor 210 and output port 236 and a source connected to current source 240 via common node N243. Unlike conventional differential amplifiers, a gate of the transistor 212 is not connected to a separate input port, but rather is connected to the input-bias node N213 through a capacitor 215, discussed below. Transistor 212 is also shown gated to a ground voltage through resistor 214, indicating DC bias of the gate. In other words, an AC input voltage, in this case ground or 0 volts, is connected to the gate of transistor 212 by way of the resistor 214. However, it would be apparent to one of ordinary skill in the art that various alternative implementations may provide an appropriate DC bias for transistor 212. For example, instead of resistor 214, the DC gate bias circuit may include a direct connection to ground, a capacitor in parallel with a resistor, a transistor circuit including an inductor, or the like, without departing from the spirit and scope of the present disclosure. Also, transistor 212 may be gated to a voltage other than ground or 0 volts.

Transistor 222 includes a drain connected to resistor 220 and output port 238, a source connected to the current source 240 via the common node N243 and a gate connected to input port 234. The gate of transistor 222 is DC biased, for example, by a connection to ground through resistor 224. As discussed above with respect to transistor 212, in various applications, the DC gate bias of transistor 222 may be provided by different configurations. For example, the value of resistor 224 may be configured to be zero ohms, i.e., a short circuit to ground. Alternatively, the DC gate bias circuit may include a capacitor in parallel with a resistor, a transistor circuit including an inductor, and/or a voltage source other than ground or 0 volts. The current source 240 biases transistors 212 and 222, which maintain high impedances. It is understood that the sources/drains of the various transistors may be reversed, without affecting the relevant functionality of the exemplary amplifier 200, depending on design factors of various embodiments.

Because the gate of transistor 212 is connected to the input-bias node N213 through the capacitor 215, an input signal received through the input-bias port 230 is gated to transistor 212. The amplifier 200 thus receives two input signals, i.e., the input signal from the input-bias port 230 and the input signal from the input port 234, even though there is no separate, dedicated input port corresponding to transistor 212. The value of the capacitor 215 may vary to provide unique benefits for any particular situation or to meet application specific design requirements of various implementations, as would be appreciated by one of ordinary skill in the art. However, the general purpose of the capacitor 215 is to cause the input AC signal presented to input-bias port 230 to be coupled to the gate terminal of transistor 212, while blocking the input DC (e.g., drain bias) signal presented to input-bias port 230 from reaching the gate of transistor 212.

According to the depicted embodiment, the input-bias port 230 has high dynamic impedance through the input-bias node N213 due to the current source 240 in the common source node N243 of the differential amplifier 200. The input-bias node N213 also acts as a virtual ground, preventing undesired feedback, since no output signal appears at the input-bias port 230.

Figure 3:
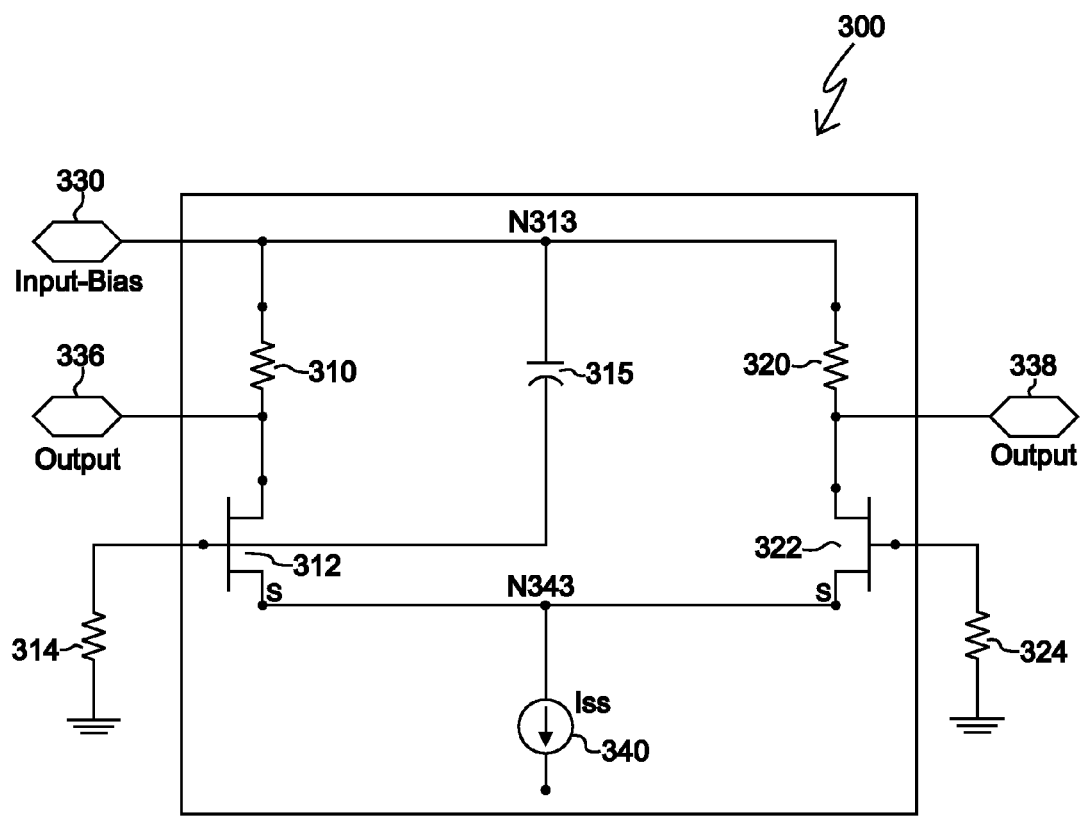
FIG. 3 is a block diagram illustrating an electronic device, according to a representative embodiment.

A combination input-bias port for receiving both an input signal and a bias signal is not limited to a differential amplifier, as depicted in FIG. 2, and may be implemented in any type of amplifier or other device requiring a bias signal input. For example, FIG. 3 is a block diagram illustrating a device 300 effectively having a single input and two balanced output, such as an active balun or a single input amplifier, according to an illustrative embodiment. As discussed above with respect to FIG. 2, the device 300 of FIG. 3 has a combined input-bias port 330, configured to receive both an input signal and a bias signal, e.g., through the same I/O package pin.

The input-bias port 330 is connected to input-bias node N313, which is common to the internal loads, depicted as resistors 310 and 320. In alternative embodiments the internal loads may be active or reactive loads, and may include, for example, transistors or other resistive elements, as opposed to (or in addition to) resistors 310 and 320.

The device 300 also includes transistors 312 and 322, which may be various types of FETs, BJTs, MOSFETs, HEMTs, pseudomorphic HEMTs, etc. Transistor 312 includes a drain connected to resistor 310 and output port 336, a source connected to current source 340 via common node N343, and a DC biased gate, e.g., connected to ground through resistance 314. The gate of transistor 312 is also connected to the input-bias node N313 through a capacitor 315. Accordingly, an input signal received through the input-bias port 330 is gated to transistor 312, so that the device 300 is configured to receive an input signal, even though there is no separate input port corresponding to transistor 312.

Transistor 322 includes a drain connected to resistor 320 and output port 338 and a source connected to the current source 340 via the common node N343. Unlike the transistor 222 illustrated in the configuration depicted in FIG. 2, a gate of transistor 322 is not connected to an input port, but rather is connected only to a DC bias circuit. For example, the gate of transistor 322 may be connected to ground or 0 volts through resistor 324, although other DC bias circuits may be provided, as discussed above. Accordingly, the device 300 has only one port for receiving an input signal, i.e., the input-bias port 330, which also receives the bias signal. The device 300 provides balanced output signals based on the input signal through output ports 336 and 338. It is understood that the sources/drains of the various transistors may be reversed, without affecting the relevant functionality of the exemplary device 300, depending on design factors of various embodiments.

As discussed above with respect to FIG. 2, the various component values of the device 300 may vary to provide unique benefits for any particular situation or to meet application specific design requirements of various implementations, as would be apparent to one skilled in the art.

Similarly, in another embodiment (not shown), one of the output ports 336 or 338 may also be left unconnected to any external load, in which case it would be unused. In this configuration, the device 300 may function as a single input, single output amplifier, for example. Whenever input ports and/or output ports are left unused, the need for corresponding I/O package pins may be further reduced, freeing up addition IC resources.

Figure 4:
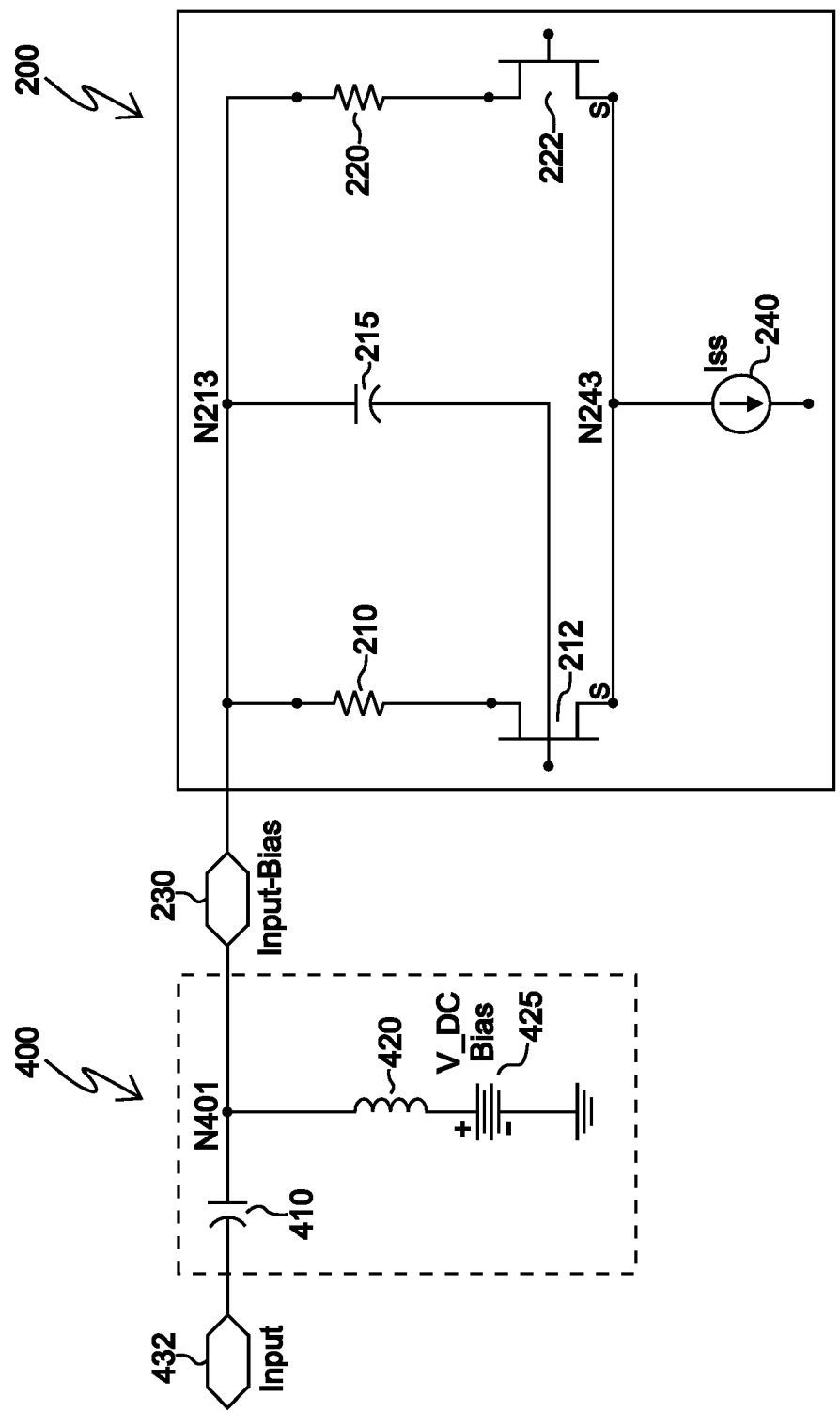
FIG. 4 is a block diagram illustrating a system including an amplifier and diplexer, according to a representative embodiment.

As previously discussed, the input signal and the bias signal may be combined to enable both signals to be received simultaneously at the input-bias port (e.g., input-bias port 230, 330). For example, in a representative embodiment, the input-bias signal may be a previously formed diplexed signal. FIG. 4 is a block diagram illustrating such a representative embodiment.

Referring to FIG. 4, a diplexer 400 is connected to an amplifier 200. For purposes of simplifying discussion, it is assumed that the circuitry of amplifier 200 in FIG. 4 is the same as discussed above with respect to FIG. 2 (although the input port 234, resistances 214, 224 and output ports 236, 238 are not shown). Descriptions of the various components of the amplifier 200 will therefore not be repeated. It is understood that the diplexer 400 of FIG. 4 may be used with other devices having a combined input-bias port, including, for example, the device 300 of FIG. 3.

The diplexer 400 is connected to the input-bias port 230 of the amplifier 200. In the representative embodiment, the diplexer 400 includes an input port 432, through which the input signal (e.g., the signal to be amplified) is received. The diplexer 400 further includes a capacitor 410 connected in series between the input port 432 and diplexer node N401, which is connected to the input-bias port 230. An inductor 420 is connected in series between the diplexer node N401 and a bias voltage source 425, which may be a DC voltage source.

The diplexer 400 receives the input signal through the input port 432 and multiplexes it at node N401 with the bias voltage from the bias voltage source 425, based on frequency domain multiplexing, for example. Accordingly, the diplexer 400 outputs a single multiplexed input-bias signal from node N401, which is provided to the input-bias port 230 of the amplifier 200.

It is understood, that the amplifier 200 (as well as device 300 of FIG. 3) is not limited to working with the exemplary diplexer 400, but is able to function with any device or circuitry capable of combining the input signal and the bias signal. For example, the input signal may ride on top of the bias signal, as stated above.

The illustrative embodiments enable an input signal and a bias signal to be received through a single port, without adversely affecting the functionality of the amplifier or other device. Accordingly, the number of I/O package pins or other connections required by the device, as well as associated circuitry and hardware, is reduced.

In view of this disclosure it is noted that variant amplifiers, baluns, diplexers and the like can be implemented in keeping with the present teachings. Further, the various components, materials, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

The invention claimed is:

1. An apparatus, comprising:
an input-bias node connected to an input-bias port for simultaneously receiving a first input signal and a bias signal;
an internal load connected between the input-bias node and first and second output ports, the first output port outputting a first output signal based on the first input signal;
a first transistor comprising a first gate connected to a capacitor connected directly to the input-bias node, and a first source/drain connected to the first output port; and
a second transistor comprising a second gate connected to an input port for receiving a second input signal, and a second source/drain connected to a second output port.

2. The apparatus of claim 1, wherein the first transistor receives the first input signal through the capacitor.

3. The apparatus of claim 2, wherein each of the first transistor and the second transistor further comprises another source/drain connected to a current source.

4. The apparatus of claim 3, wherein the load comprises first and second resistors, the first resistor being connected between the input-bias node and the first source/drain of the first transistor, and the second resistor being connected between the input-bias node and the second source/drain of the second transistor.

5. The apparatus of claim 4, wherein the first gate of the first transistor is further connected to a first gate bias circuit and the second gate of the second transistor is further connected to a second gate bias circuit.

6. The apparatus of claim 5, wherein each of the first and second gate bias circuits comprises a resistor connected to ground.

7. The apparatus of claim 5, wherein the apparatus comprises an active balun, and output signals output from the first and second output ports are balanced.

8. The apparatus of claim 5, wherein the apparatus comprises a differential amplifier, and output signals output from the first and second output ports are balanced.

9. The apparatus of claim 1, wherein the bias signal comprises a direct current (DC) signal.

10. The apparatus of claim 9, wherein input signal rides on top of the DC bias signal received at the input-bias node.

11. The apparatus of claim 9, wherein the input signal is multiplexed with the DC bias signal received at the input-bias node.

12. A system for amplifying an input signal, comprising:
a diplexer configured to combine the input signal and a bias signal;
an input-bias node connected to an input-bias port configured to receive the combined signal from the diplexer;
a first resistance connected in series between the input-bias node and a first output port;
a second resistance connected in series between the input-bias node and a second output port;
a first transistor connected between the first output port and a current source, and gated to a first capacitor connected to the input-bias node; and
a second transistor connected between the second output port and the current source,
wherein balanced output signals based on the input signal are provided through the first and second output ports.

13. The system of claim 12, wherein the diplexer comprises:
   a second capacitor coupled in series between an input port, configured to receive the input signal, and a diplexer node connected to the input-bias port; and
   an inductor coupled in series between the diplexer node and a DC bias voltage.

14. The system of claim 13, wherein the second transistor is gated to a ground voltage.

15. The system of claim 13, wherein the second transistor is gated to an input port for receiving a second input signal, and the balanced output signals are further based on the second input signal.

16. The system of claim 13, wherein each of the first and second transistors comprises a field effect transistor.

17. The system of claim 16, wherein each of the first and second resistances comprises an active load.

18. The system of claim 16, wherein each of the first and second resistances comprises an inactive load.

19. An amplifier, comprising:
   an input-bias node configured to receive an input signal and a direct current (DC) bias signal through an input-bias port;
   a first resistance connected in series between the input-bias node and a first output port;
   a second resistance connected in series between the input-bias node and a second output port;
   a first field effect transistor (FET) connected between the first output port and a current source, the first FET comprising a first gate connected to the input-bias node through a capacitor; and
   a second FET connected between the second output port and the current source, the second FET comprising a second gate connected to at least one of a ground voltage and an input port.

* * * * *